(12) United States Patent
Lee (10) Patent No.: US 11,189,555 B2
(45) Date of Patent: Nov. 30, 2021

(54) CHIP PACKAGING WITH MULTILAYER CONDUCTIVE CIRCUIT

(71) Applicant: DELTA ELECTRONICS, INC., Taoyuan (TW)

(72) Inventor: Peng-Hsin Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/846,397

(22) Filed: Apr. 12, 2020

(65) Prior Publication Data

US 2020/0243434 A1 Jul. 30, 2020

Related U.S. Application Data

(63) Continuation-in-part of application No. 16/551,717, filed on Aug. 27, 2019.

(60) Provisional application No. 62/798,487, filed on Jan. 30, 2019.

(51) Int. Cl.
*H01L 23/498* (2006.01)
*H01L 23/00* (2006.01)

(52) U.S. Cl.
CPC ........ *H01L 23/49838* (2013.01); *H01L 24/13* (2013.01); *H01L 2924/37001* (2013.01)

(58) Field of Classification Search
CPC ............... H01L 23/49838; H01L 24/13; H01L 2924/37001; H01L 24/32; H01L 24/29; H01L 24/16; H01L 2224/04026; H01L 2224/13147; H01L 2224/291; H01L 2224/32225; H01L 24/17; H01L 2224/131; H01L 2224/0401; H01L 2224/17106; H01L 2224/16227; H01L 2924/15313; H01L 23/49534; H01L 23/49541; H01L 23/49562; H01L 23/49844; H01L 23/49822

See application file for complete search history.

(56) References Cited

U.S. PATENT DOCUMENTS

| 7,816,784 | B2 | 10/2010 | Son et al. |
| 2002/0187318 | A1 | 12/2002 | Yoshihisa et al. |
| 2006/0180931 | A1 | 8/2006 | Luo et al. |
| 2007/0170564 | A1 | 7/2007 | Drummer et al. |
| 2008/0258294 | A1 | 10/2008 | Tseng et al. |
| 2010/0181658 | A1 | 7/2010 | Yamashita |

(Continued)

FOREIGN PATENT DOCUMENTS

| CN | 206806321 U | 12/2017 |
| CN | 108878297 A | 11/2018 |

(Continued)

*Primary Examiner* — Wasiul Haider
(74) *Attorney, Agent, or Firm* — CKC & Partners Co., LLC (57) ABSTRACT

A semiconductor device includes a substrate and a chip. The substrate has a first conduction layer, a second conduction layer, and an isolation layer disposed between the first conduction layer and the second conduction layer. The first conductive layer has a first portion and a second portion spaced apart from the first portion, and each of the first portion and the second portion includes a main part and a plurality of extension parts extending from the main part. The chip is disposed on the extension parts of the first portion and the second portion of the first conductive layer.

14 Claims, 5 Drawing Sheets

(56) References Cited

U.S. PATENT DOCUMENTS

| | | | |
|---|---|---|---|
| 2011/0204343 A1* | 8/2011 | Birnstock | H01L 51/5209 |
| | | | 257/40 |
| 2011/0241203 A1* | 10/2011 | Nakasato | H05K 3/3436 |
| | | | 257/737 |
| 2012/0098005 A1* | 4/2012 | Chan | H01L 33/507 |
| | | | 257/98 |
| 2013/0256856 A1 | 10/2013 | Joachim et al. | |
| 2015/0155267 A1 | 6/2015 | Hoegerl et al. | |
| 2015/0340350 A1 | 11/2015 | Koga | |
| 2020/0211992 A1* | 7/2020 | Thompson | H01L 24/14 |

FOREIGN PATENT DOCUMENTS

| | | |
|---|---|---|
| DE | 10235332 A1 | 2/2004 |
| EP | 2211597 A1 | 7/2010 |
| TW | 419348 B | 12/2013 |
| TW | I456711 B | 10/2014 |
| TW | 201740522 A | 11/2017 |
| WO | 0124260 A1 | 4/2001 |
| WO | 2010141432 A1 | 12/2010 |
| WO | 2018093987 A1 | 5/2018 |

\* cited by examiner

CHIP PACKAGING WITH MULTILAYER CONDUCTIVE CIRCUIT

CROSS-REFERENCE TO RELATED APPLICATION

This application is a Continuation-in-part of U.S. application Ser. No. 16/551,717, filed on Aug. 27, 2019, which claims priority of U.S. Provisional Application Ser. No. 62/798,487, filed on Jan. 30, 2019, the entirety of which is incorporated by references herein in their entireties.

BACKGROUND

Field of Invention

The present invention relates to a semiconductor device.

Description of Related Art

For a typical power semiconductor device, circuit may be collected through the metal structures in a chip (e.g., electrodes or metal lines), and a solder bump or wires located at end of the metal structures may transmit the circuit to a lead frame or a print circuit board. However, a thickness of the metal structures in the chip is thinner, such that the load current is limited. Furthermore, a voltage difference of the metal structures may cause the opening time be out of synchronization. Therefore, there is a need for a semiconductor device that may increase the load current and reduce the voltage difference.

SUMMARY

An aspect of the present disclosure is to provide a semiconductor device.

In some embodiments, the semiconductor device includes a substrate and a chip. The substrate has a first conduction layer, a second conduction layer, and an isolation layer disposed between the first conduction layer and the second conduction layer. The first conductive layer has a first portion and a second portion spaced apart from the first portion, and each of the first portion and the second portion includes a main part and a plurality of extension parts extending from the main part. The chip is disposed on the extension parts of the first portion and the second portion of the first conductive layer.

In some embodiments, the extension parts of the first portion and the extension parts of the second portion extend along a first direction and are alternately arranged along a second direction different from the first direction.

In some embodiments, the extension parts of the first portion extend toward the second portion, and the extension parts of the second portion toward the first portion.

In some embodiments, the extension parts of the first portion are perpendicular to the main part of the first portion, and the extension parts of the second portion are perpendicular to the main part of the second portion.

In some embodiments, the extension parts of the first portion and the extension parts of the second portion are parallel to each other.

In some embodiments, each of the extension parts has an average width and a length, and the length is three times of the average width.

In some embodiments, each of the extension parts has a first end proximal to the corresponding main part and a second end away from the corresponding main part, and a width of the first end is greater than a width of the second end.

In some embodiments, each of the extension parts has a trapezoid shape.

In some embodiments, the semiconductor device further includes a conductive structure disposed in the isolation layer, and the first conduction layer is electrically connected with the second conduction layer through the conductive structure.

In some embodiments, the chip overlaps at least one of the extension parts of the first portion and at least one of the extension parts of the second portion.

In some embodiments, the isolation layer is made of a material comprising one of nitride and oxide mixed with at least one of epoxy and In some embodiments, the semiconductor device further includes an attach material disposed between a bottom surface of the chip and the extension parts of the first portion and the second portion of the first conduction layer.

In some embodiments, the attach material includes at least one of a solder bump, solder paste, and a solder ball.

In some embodiments, the attach material includes a copper pillar.

In the aforementioned embodiments, when the circuit is collected through the metal structures of the chip (e.g., electrodes), the circuit may transmit to the extension parts. As such, the electrodes of the chip and the extension parts of the first conduction layer may form an effective metal structure. Therefore, the thickness of the effective metal structure is increased, and a cross sectional area of the effective metal structure is also increased so as to increase the load current. In addition, increasing of the cross sectional area of the effective metal structure may reduce the resistance, such that the voltage difference may be reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
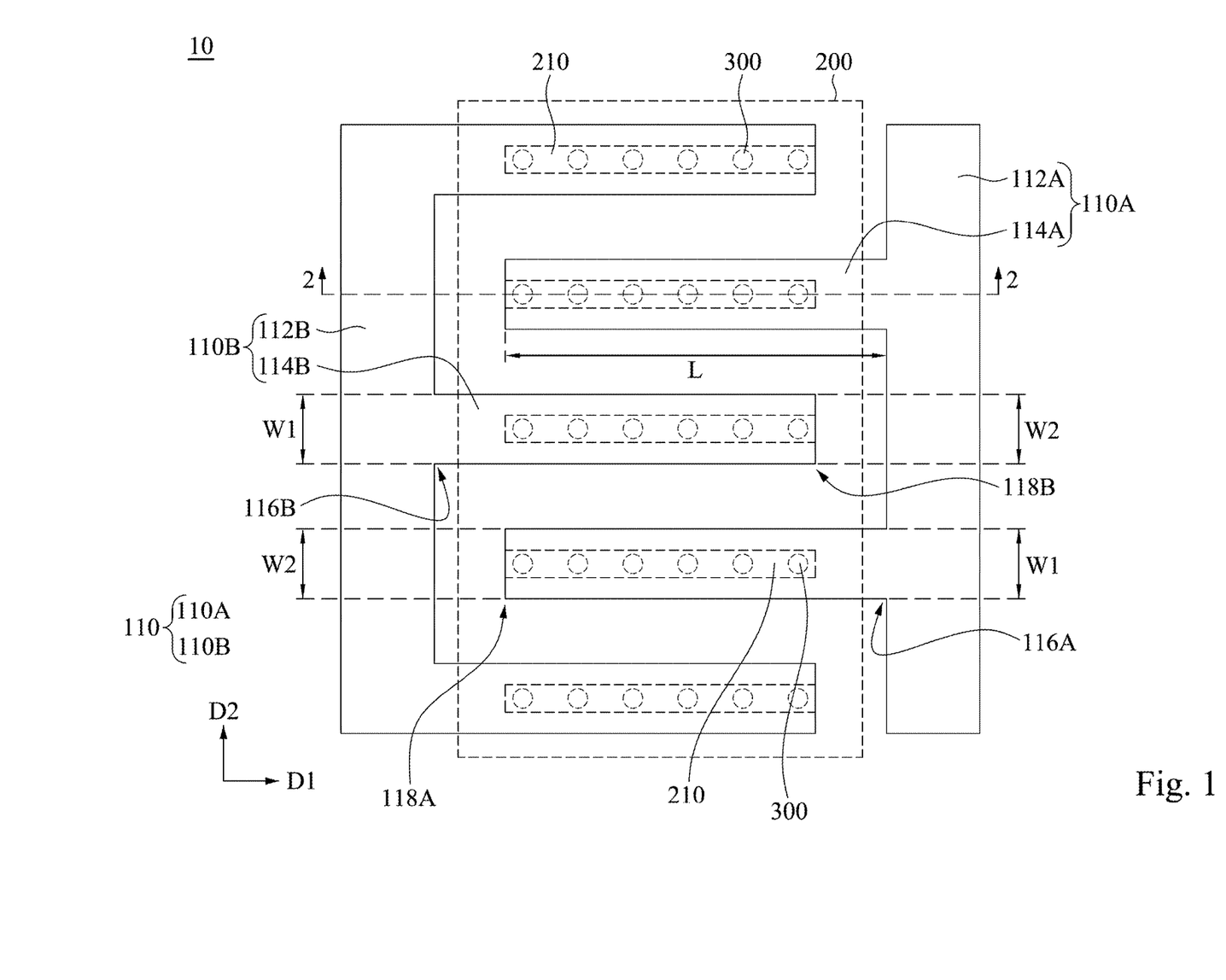
FIG. 1 is a bottom view of a semiconductor device according to some embodiments of the present disclosure.
Figure 2:
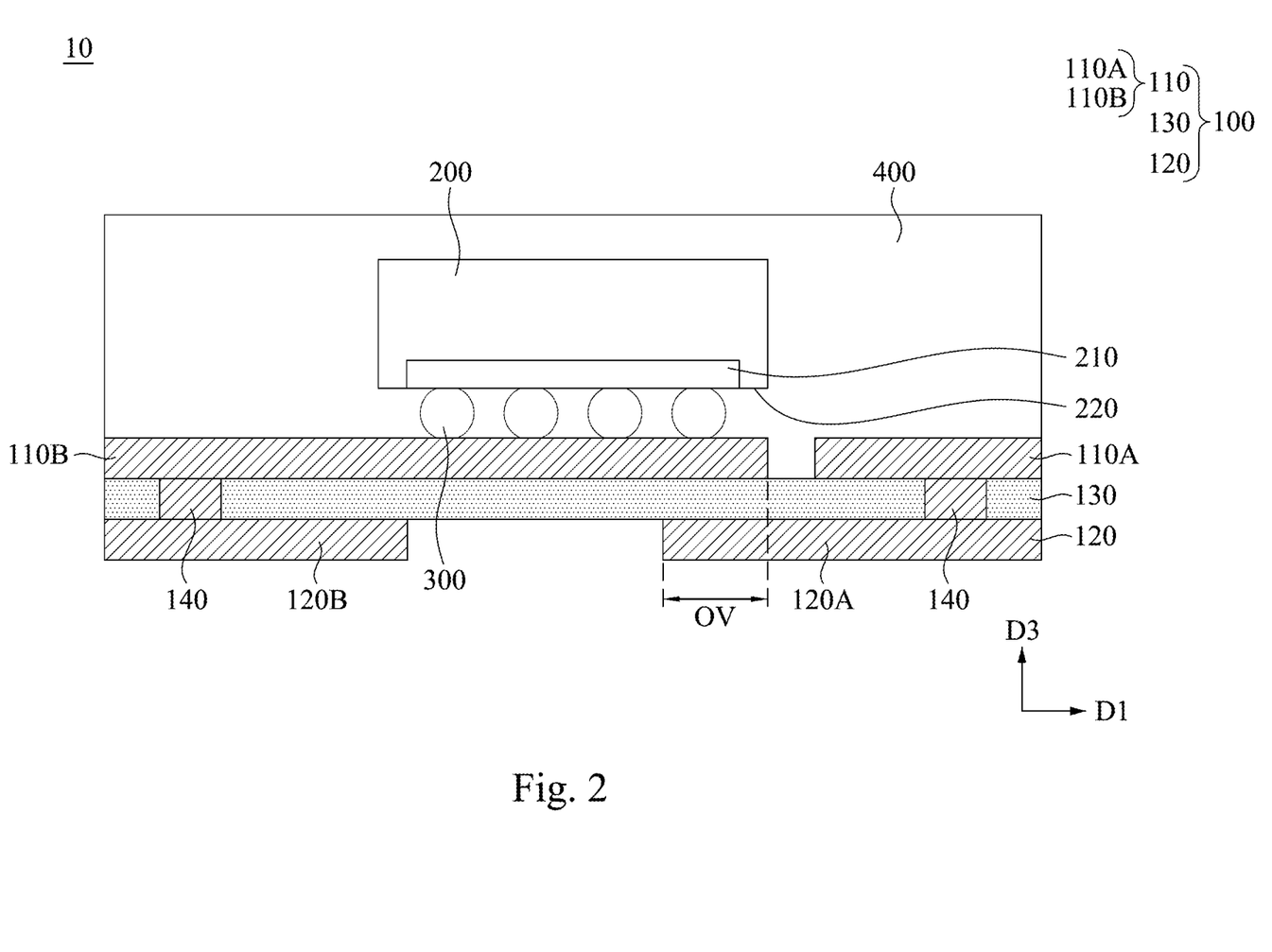
FIG. 2 is a cross-sectional view taken along line 2-2 in FIG. 1.

FIG. 1 is a bottom view of a semiconductor device 10 according to some embodiments of the present disclosure. FIG. 2 is a cross-sectional view taken along line 2-2 in FIG. 1. The semiconductor device 10 includes a substrate 100 and a chip 200. The substrate 100 includes a first conduction layer 110, a second conduction layer 120, and an isolation layer 130 disposed between the first conduction layer 110 and the second conduction layer 120. The first conductive layer 100 have a first portion 110A and a second portion 110B spaced apart from the first portion 110A. The first portion 110A includes a main part 112A and a plurality of extension parts 114A extending from the main part 112A. The second portion 110B includes a main part 112B and a plurality of extension parts 114B extending from the main part 112B. The chip 200 is disposed on the extension parts 114A of the first portion 110A and the extension parts 114B of the second portion 110B of the first conductive layer 110. For clarity, the second conduction layer 120 and the isolation layer 130 are omitted in FIG. 1.

The chip 200 includes a plurality of electrodes 210 and a bottom surface 220 facing the first conduction layer 110. The semiconductor device 10 further includes attach materials 300 and encapsulation 400. The attach materials 300 disposed between the bottom surface 220 of the chip 200 and the extension parts 114A of the first portion 110A and the extension parts 114B of the second portion 110B of the first conduction layer 110. The electrodes 210 are electrically connected with the extension parts 114A, 114B through the attach materials 300. In the present embodiment, the attach materials 300 include solder bumps or solder balls. The chip 200 overlaps at least one of the extension parts 114A of the first portion 110A and at least one of the extension parts 114B of the second portion 110B. The encapsulation 400 covers the chip 200, the attach materials 300, and the substrate 100.

As shown in FIG. 1, the extension parts 114A of the first portion 110A and the extension parts 114B of the second portion 110B extend along a first direction D1 and are alternately arranged along a second direction D2 different from the first direction D1. For example, in the present embodiment, the first direction D1 is perpendicular to the second direction D2. The main part 112A and the extension part 112B extend along the second direction D2. The extension parts 114A of the first portion 110A extend toward the second portion 110B, and the extension parts 114B of the second portion 110B extend toward the first portion 110A. The extension parts 114A of the first portion 110A are perpendicular to the main part 112A of the first portion 110A, and the extension parts 114B of the second portion 110B are perpendicular to the main part 112B of the second portion 110B. The extension parts 114A of the first portion 110A and the extension parts 114B of the second portion 110B are parallel to each other. In other words, the first conduction layer 110 forms a extension-shaped structure.

The extension parts 114A of the first portion 110A each has a first end 116A proximal to the corresponding main part 112A and a second end 118A away from the corresponding main part 112A. The extension parts 114B of the second portion 110B each has a first end 116B proximal to the corresponding main part 112B and a second end 118B away from the corresponding main part 112B. The first end 116A, 116B each has a width W1 measured along the second direction D2, and the second end 118A, 118B each has a width W2 measured along the second direction D2. In the present embodiment, the width W1 is substantially equal to the width W2, but the present disclosure is not limited in this regard. The extension parts 114A, 114B each has an average width W3 which is an average of widths measured at different locations (e.g., intermediated sections between the first end 116A, 116B and the second end 118A, 118B) of the extension parts 114A, 114B. Each of the extension parts 114A, 114B has a length L measured along the first direction D1, and the length L is about three times of the average width W3.

The extension parts 114A, 114B of the first conduction layer 110 of the semiconductor device 10 may provide a path for collecting the circuit. That is, when the circuit is collected through the metal structures (e.g., the electrodes 210), the circuit may transmit to the extension parts 114A, 114B through the attached materials 300. As such, the electrodes 210 of the chip 200, the attach materials 300, and the extension parts 114A, 114B of the first conduction layer 110 may collectively form an effective metal structure. Therefore, the thickness of the effective metal structure is increased (i.e., greater than the thickness of the electrodes 210), and a cross sectional area of the effective metal structure is also increased (i.e., greater than the cross sectional area of the electrodes 210) so as to increase the load current. For example, in some embodiments, the thickness of the effective metal structure may be greater than 100 um. In addition, increasing of the cross sectional area of the effective metal structure may reduce the resistance, such that the voltage difference may be reduced.

The semiconductor device 10 further includes conductive structures 140 disposed in the isolation layer 130, wherein the first conduction layer 110 is electrically connected with the second conduction layer 120 through the conductive structures 140. The first portions 110A of the first conduction layer 110 is electrically insulated from the second portion 110B of the first conduction layer 110. As shown in FIG. 2, the second conduction layer 120 includes a plurality of portions 120A, 120B that are electrically insulated and spaced apart from each other. The isolation layer 130 is partially exposed from the first conduction layer 110 and the second conduction layer 120.

Specifically, as shown in FIG. 2, first portions 112A, 112B are electrically connected with two portions 120A, 120B of the second conduction layer 120 through two conductive structures 140, respectively. However, the second portion 110B of the first conduction layer 110 is insulated from the portion 120A of the second conduction layer 120 by the isolation layer 130. The first portion 110A of the first conduction layer 110 is insulated from the portion 120B of the second conduction layer 120 by the isolation layer 130.

The isolation layer 130 is made of a material including one of nitride and oxide mixed with at least one of epoxy and polymer. Therefore, the thickness of the isolation layer 130 can be minimized. For example, in some embodiments, the thickness of the isolation layer 130 is less than 150 micrometers and greater than 40 micrometers. In some other embodiments, the thickness of the isolation layer 130 is less than 150 micrometers and greater than 10 micrometers, but the present disclosure is not limited in this regard.

A typical lead frame includes a pattern designed based on the signal transmission path between a chip (such as the chip 200) and an external device, for example, a printed circuit board. The pattern of the lead frame at least includes die pads, inner leads, outer leads, and bar structures that connect those leads to support the pattern of the lead frame before the chip is encapsulated.

In the present embodiment, first portion 110A and the second portion 110B of the first conduction layer 110 may form a pattern, the portions 120A, 120B of the second conduction layer 120 may form another pattern, and these two patterns are separated by the isolation layer 130. In other words, the pattern of the first conduction layer 110 and the pattern of the second conduction layer 120 connected through conductive structures 140 can form signal transmission paths that replace the typical lead frame.

However, since the isolation layer 130 is in contact with the entire pattern of the first conduction layer 110, first portion 110A and the second portion 110B of the first conduction layer 110 can be isolated from each other without connected by bar structures used in conventional package structures. Similarly, since the isolation layer 130 is in contact with the entire pattern of the second conduction layer 120, portions 120A, 120B of the second conduction layer 120 can be isolated from each other without connected by the bar structures. In other words, since the isolation layer 130 is disposed between the first conduction layer 110 and the second conduction layer 120, the patterns of the first conduction layer 110 and the second conduction layer 120 can be supported by the isolation layer 130. Therefore, the design flexibility of the patterns of the first conduction layer 110 and the second conduction layer 120 can be increased. Accordingly, the densities of the extension parts 114A, 114B of the first conduction layer 110 and the second conduction layer 120 can be increased.

During a typical die attachment process, the lead frame is deformed due to the weight of the chip. Therefore, the yield rate of the package structure is limited. The isolation layer 130 of the present disclosure can provide a supporting force that prevents the first conduction layer 110 and the second conduction layer 120 from bending during the die attachment process. Accordingly, the die attachment process can be more stable and the yield rate of the semiconductor device 10 can be improved.

A high power semiconductor device requires a higher insulating ability for applications with high voltage. Otherwise, when the insulating ability provided by the encapsulation 400 is not enough, device failure may happen. The isolation layer 130 of the present disclosure can increase the insulating ability, thereby increasing the breakdown voltage of the semiconductor device 10. In some embodiments, the breakdown voltage can be increased by four times. In some embodiments, the chip 200 is a high power semiconductor device, and is composed of gallium nitride (GaN) or silicon carbide (SiC). In some other embodiments, the chip 200 is a silicon-based semiconductor device.

As shown in FIG. 2, along a third direction D3 extending from the second conduction layer 120 to the first conduction layer 110, the second portion 110B and the portion 120A of the second conduction layer 120 that are electrically insulated from each other are partially overlapped (as indicated by the overlapping region OV). In other words, a projection of the second portion 110B of the first conduction layer 110 along the third direction D3 and a projection of the portion 120A along the third direction D3 are overlapped. Therefore, the area for heat conduction can be increased. Accordingly, the thermal dissipation ability can be increased, and the thermal resistance can be reduced.

Figure 3:
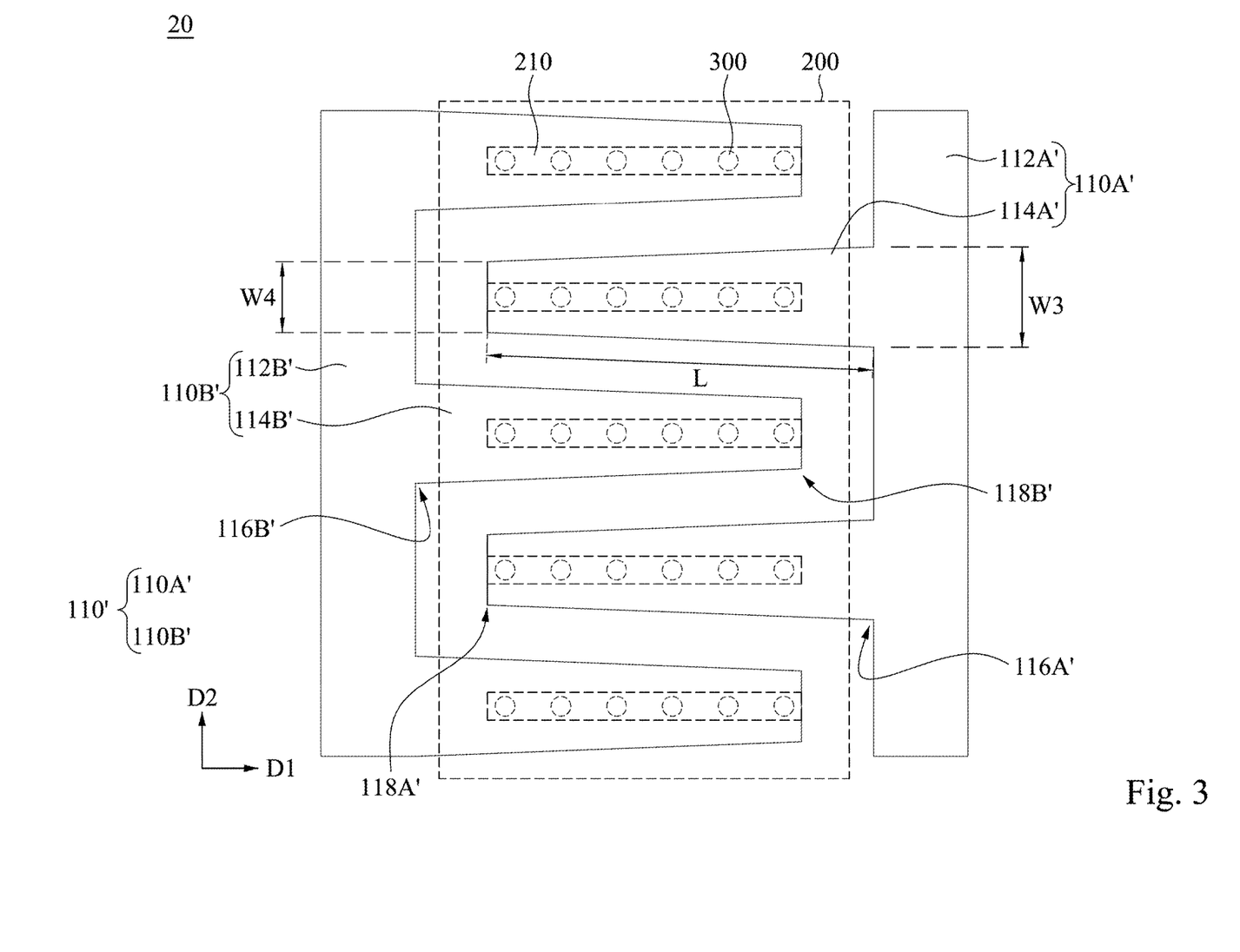
FIG. 3 is a bottom view of a semiconductor device according to one embodiments of the present disclosure.

FIG. 3 is a bottom view of a semiconductor device 20 according to one embodiments of the present disclosure. The semiconductor device 20 is similar to the semiconductor device 10 in FIG. 1, the difference is that each of the extension parts 114A', 114B' of the semiconductor device 20 has a trapezoid shape. The extension parts 114A' of the first portion 110A' each has a first end 116A' proximal to the corresponding main part 112A' and a second end 118A' away from the corresponding main part 112A'. The extension parts 114B' of the second portion 110B' each has a first end 116B' proximal to the corresponding main part 112B' and a second end 118B' away from the corresponding main part 112B'. The first end 116A', 116B' each has a width W3, and the second end 118A', 118B' each has a width W4. In the present embodiment, the width W3 is greater than the width W4. In addition, the average width of the extension parts 114A' may be the average of a sum of the width W3 of the first end 116A' and the width W4 of the second end 118A'. Similarly, the average width of the extension parts 114B' may be the average of a sum of the width W3 and the width W4 of the first end 116B' and the width W4 of the second end 118B'. The semiconductor device 20 has similar advantages as the semiconductor device 10 as shown in FIG. 1, and a description is not repeated hereinafter.

Figure 4:
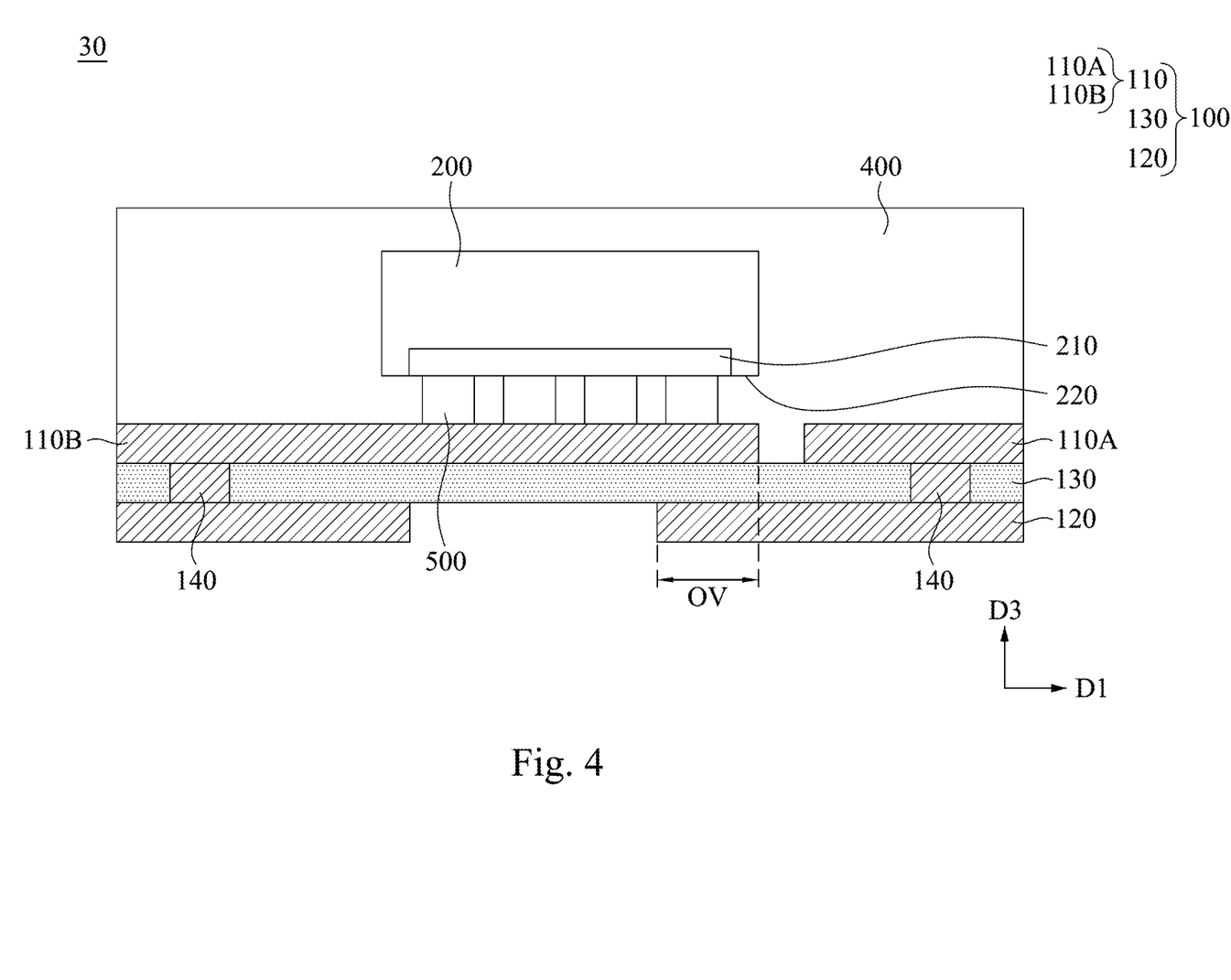
FIG. 4 is a cross-sectional view of a semiconductor device according to one embodiment of the present disclosure.

FIG. 4 is a cross-sectional view of a semiconductor device 30 according to one embodiment of the present disclosure. The semiconductor device 30 is similar to the semiconductor device 10 as shown in FIG. 2, the difference is that the attach materials 500 of the semiconductor device 30 include copper pillars. The semiconductor device 30 has similar advantages as the semiconductor device 10 as shown in FIG. 2, and a description is not repeated hereinafter.

Figure 5:
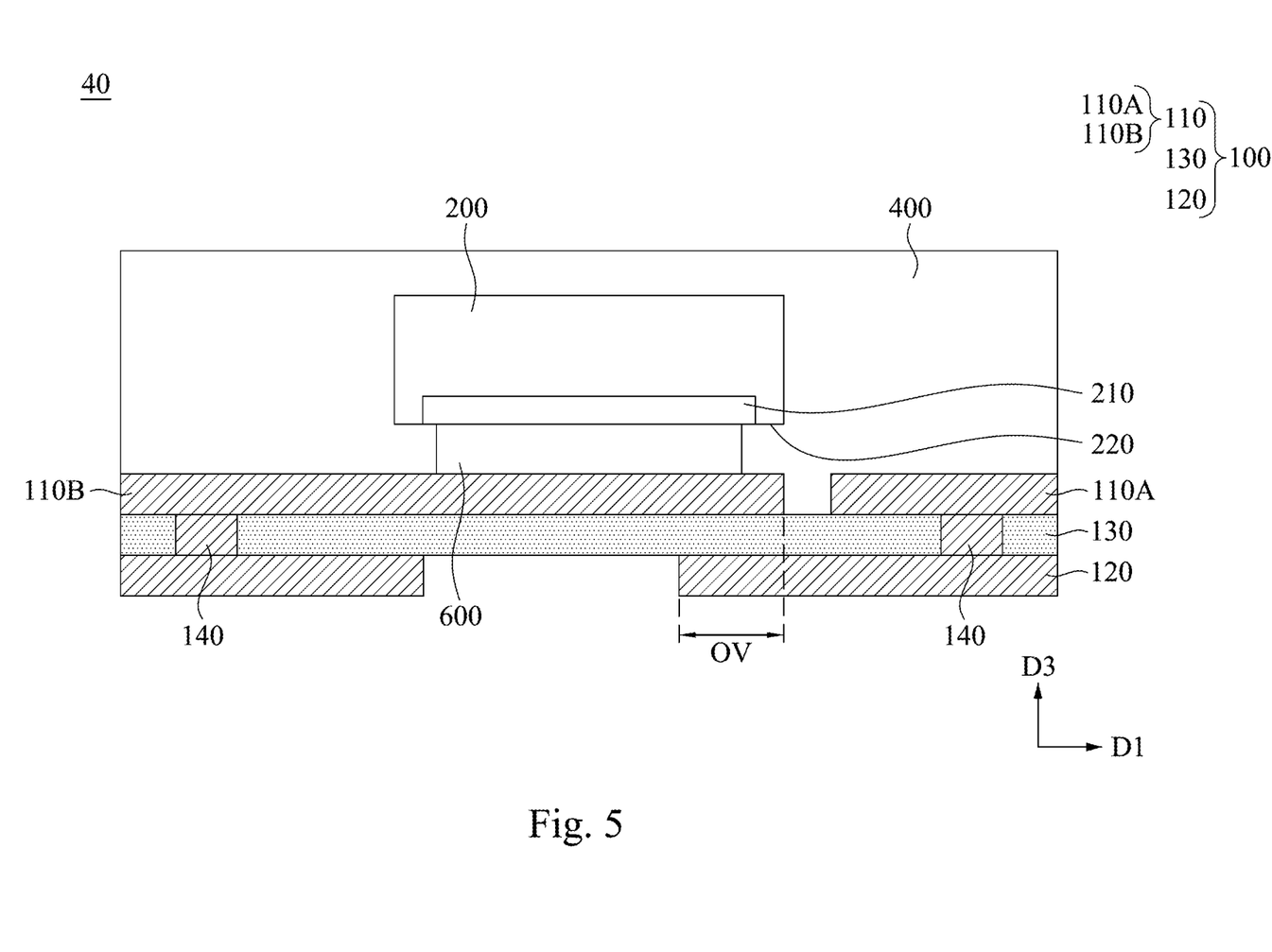
FIG. 5 is a cross-sectional view of a semiconductor device according to one embodiment of the present disclosure.

FIG. 5 is a cross-sectional view of a semiconductor device 40 according to one embodiment of the present disclosure. The semiconductor device 40 is similar to the semiconductor device 10 as shown in FIG. 2, the difference is that the attach material 600 of the semiconductor device 30 includes solder paste. The semiconductor device 40 has similar advantages as the semiconductor device 10 as shown in FIG. 2, and a description is not repeated hereinafter.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A semiconductor device, comprising:
a substrate having a first conduction layer, a second conduction layer, and an isolation layer disposed between the first conduction layer and the second conduction layer, wherein the first conductive layer has a first portion and a second portion spaced apart from the first portion, and each of the first portion and the second portion comprises a main part and a plurality of extension parts extending from the main part; and
a chip disposed on the extension parts of the first portion and the second portion of the first conductive layer;
wherein the extension part of the second portion of the first conduction layer comprises a distal end distal to the main part of the second portion of the first conduction layer, and wherein at the distal end of the extension part of the second portion, the first conduction layer, the isolation layer and the second conduction layer form an overlapping region below the chip along a third direction, the third direction extends from the second conduction layer to the first conduction layer.
2. The semiconductor device of claim 1, wherein the extension parts of the first portion and the extension parts of the second portion extend along a first direction and are alternately arranged along a second direction different from the first direction.

3. The semiconductor device of claim 1, wherein the extension parts of the first portion extend toward the second portion, and the extension parts of the second portion toward the first portion.

4. The semiconductor device of claim 1, wherein the extension parts of the first portion are perpendicular to the main part of the first portion, and the extension parts of the second portion are perpendicular to the main part of the second portion.

5. The semiconductor device of claim 1, wherein the extension parts of the first portion and the extension parts of the second portion are parallel to each other.

6. The semiconductor device of claim 1, wherein each of the extension parts has an average width and a length, and the length is three times of the average width.

7. The semiconductor device of claim 1, wherein each of the extension parts has a first end proximal to the corresponding main part and a second end away from the corresponding main part, and a width of the first end is greater than a width of the second end.

8. The semiconductor device of claim 1, wherein each of the extension parts has a trapezoid shape.

9. The semiconductor device of claim 1, further comprising:

a conductive structure disposed in the isolation layer, wherein the first conduction layer is electrically connected with the second conduction layer through the conductive structure.

10. The semiconductor device of claim 1, wherein the chip overlaps at least one of the extension parts of the first portion and at least one of the extension parts of the second portion.

11. The semiconductor device of claim 1, wherein the isolation layer is made of a material comprising one of nitride and oxide mixed with at least one of epoxy and polymer.

12. The semiconductor device of claim 1, further comprising:

an attach material disposed between a bottom surface of the chip and the extension parts of the first portion and the second portion of the first conduction layer.

13. The semiconductor device of claim 12, wherein the attach material comprises at least one of a solder bump, solder paste, and a solder ball.

14. The semiconductor device of claim 12, wherein the attach material comprises a copper pillar.

* * * * *